United States Patent [19]
Ferraiolo et al.

[11] Patent Number: 5,694,087
[45] Date of Patent: Dec. 2, 1997

[54] ANTI-LATCHING MECHANISM FOR PHASE LOCK LOOPS

[75] Inventors: Frank D. Ferraiolo, Essex Junction; John E. Gersbach, Burlington; Masayuki Hayashi, Williston; Ilya I. Novof; Charles J. Masenas, Jr., both of Essex Junction, all of Vt.

[73] Assignee: International Business Machines Corporation, Armonk, N.Y.

[21] Appl. No.: 592,902

[22] Filed: Jan. 29, 1996

[51] Int. Cl.$^6$ ............................................. H03L 7/093
[52] U.S. Cl. ............................ 331/11; 331/14; 331/17; 331/25
[58] Field of Search ................................ 331/10, 11, 16, 331/17, 14, 25

[56] References Cited

U.S. PATENT DOCUMENTS 5,208,555  5/1993  Graham et al. ........................... 331/11

Primary Examiner—Siegfried H. Grimm
Attorney, Agent, or Firm—Eugene I. Shkurko

[57] ABSTRACT

A protective circuit for a phase lock loop ensures that the VCO does not initiate a runaway condition when outputting a signal having a frequency higher than the feedback divider can respond to. During normal phase lock operation, a counter keeps track of the PLL input signal and is reset by the feedback divider. In the runaway condition the counter is not reset and triggers a control signal to the VCO. A second counter can be used to keep track of the feedback divider output and to reset the first counter. When the first counter far outruns the second counter the control signal is triggered.

15 Claims, 3 Drawing Sheets

ANTI-LATCHING MECHANISM
FOR PHASE LOCK LOOPS

ANTI-LATCHING MECHANISM FOR PHASE LOCK LOOPS

BACKGROUND OF THE INVENTION

1. Technical Field of the Invention

This invention pertains to Phase Lock Loops (PLLs). In particular, this invention provides a mechanism for preventing latch-up of the voltage controlled oscillator (VCO), thereby enhancing reliability of the PLL.

2. Background Art

Many phase lock loops are configured with a feedback divider circuit to facilitate multiplication of the input frequency. The VCO, which provides the multiplied frequency at its output, may be capable of generating frequencies higher than the feedback divider can follow or respond to. When this happens the feedback divider output dies and the phase detector senses that the output frequency is too low when it is really too high and the VCO is driven to an even higher frequency. This runaway condition continues until the VCO is latched at its maximum frequency and the feedback divider continues not to pass any pulses at all.

Many phase lock loops now in use encounter the failure mode described above. It is usually not a problem by virtue of the control loop which maintains the output frequency at the desired value. It is however, of sufficient nuisance value to make a solution well worth the trouble to implement and the extra silicon area required. It becomes a serious problem when the operating frequency is near the limit of the feedback divider's capability and/or when minor defects are present that either degrade the feedback divider or enhance the VCO maximum frequency limit.

It may also be a problem when unusually high levels of noise are encountered in certain applications or in certain environments. When this failure occurs, the loop is latched up in the failed condition until power is removed and re-applied.

It is an object of the invention to provide a circuit to automatically detect a runaway condition and reset the PLL.

It is another object of the invention to provide a more reliable PLL by avoiding, or minimizing, the duration of a latching failure.

SUMMARY OF THE INVENTION

This invention provides an apparatus and method of detecting a runaway condition in a PLL wherein the feedback divider is supplying fewer pulses than are logically required. Corrective circuitry reduces the input to the VCO, thereby reducing the VCO output frequency supplied to the feedback divider. In a first preferred embodiment, an apparatus is provided, for use with a conventional PLL, having an anti-latching circuit including a counter for counting the PLL input signal and a reset means resetting the counter to zero at selected pulses of the feedback divider signal. Another circuit outputs a control signal, in response to the counter reaching a predetermined number, which causes a control circuit to reduce the voltage at the VCO input.

In a second preferred embodiment, a method is described whereby a conventional PLL is operated by counting input signals and restarting the counting with selected outputs of the feedback divider. The input voltage to the VCO is reduced if the count reaches a preset number.

Other embodiments, features, and advantages of this invention will become apparent from the following detailed description of the presently preferred embodiment of the invention, taken in conjunction with the accompanying drawings.

BEST MODE FOR CARRYING OUT THE INVENTION

Figure 1:
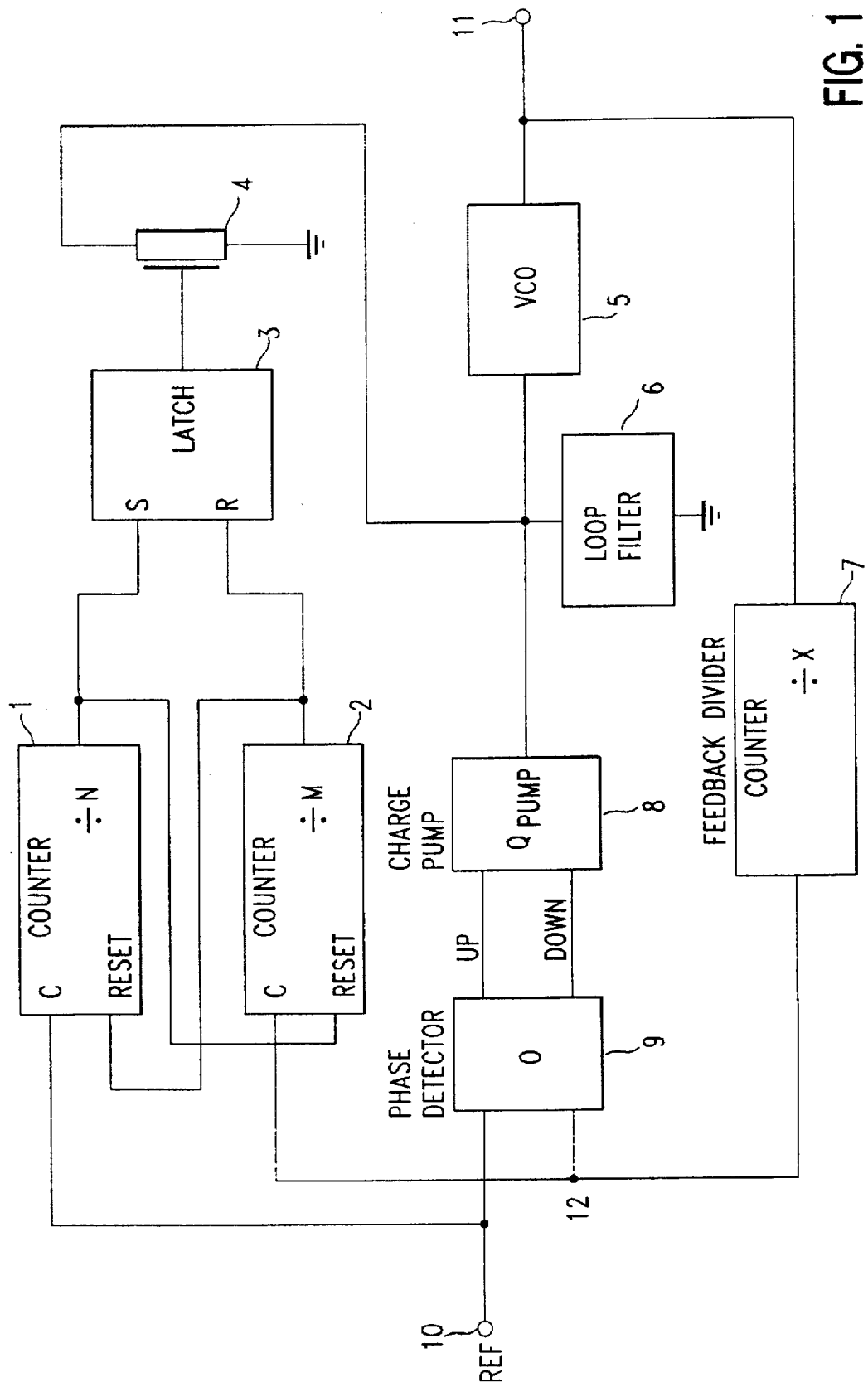
FIG. 1 illustrates an embodiment of the present invention coupled to a conventional PLL.

FIG. 1 shows a block diagram of a classical phase lock loop (PLL) with the present invention. The classical block diagram includes the phase detector 9, charge pump 8, filter 6, VCO 5 and feedback divider 7. The high frequency latch-up detector comprises two resettable counters M2 and N1, a set/reset latch 3, and a charge subtractor circuit 4, which is implemented as a simple NFET transistor in the presently preferred embodiment. The NFET 4 is selected to be small compared to the capacitance of the loop filter 6 to minimize noise input and to facilitate the charge pump 8 control over the VCO input voltage. The N counter 1 counts the pulses supplied by the reference frequency $F_{ref}$ 10. The M counter 2 counts output pulses from the feedback divider. The N counter 1 is reset to zero each time the M counter 2 supplies an output pulse to the N counter's reset input, i.e., each $M^{th}$ time the feedback divider supplies an output pulse to the M counter's input. If N is chosen to be sufficiently large (always larger than M), then during normal operation of the PLL, the N counter will not, even under transient conditions, produce an output. When in the locked condition, the N count will never exceed M. The value of N must always be greater than M. If these criteria are satisfied, the N counter 1 will never supply an output to set the latch 3 under normal conditions. It may be prudent to supply a reset signal at power-on to the reset inputs of the M and N counters as well as the latch 3 to ensure a clean start.

If the VCO output 11 should go high enough in frequency to cause the feedback divider 7 to start missing pulses, the N counter 1 will provide a set pulse to the latch 3, which also serves as a reset pulse to the M counter 2, after N reference cycles without a burst of M pulses from the feedback divider 7. This will cause the charge subtractor 4 to reduce the filter 6 voltage, lowering the VCO 5 frequency, and the M counter 2 to be reset. When the VCO frequency is again low enough for the feedback divider, the Mth positive edge will cause the N counter 1 and latch 3 to be reset. The charge subtractor 4 turns off and the loop once again controls the VCO frequency.

Figure 2:
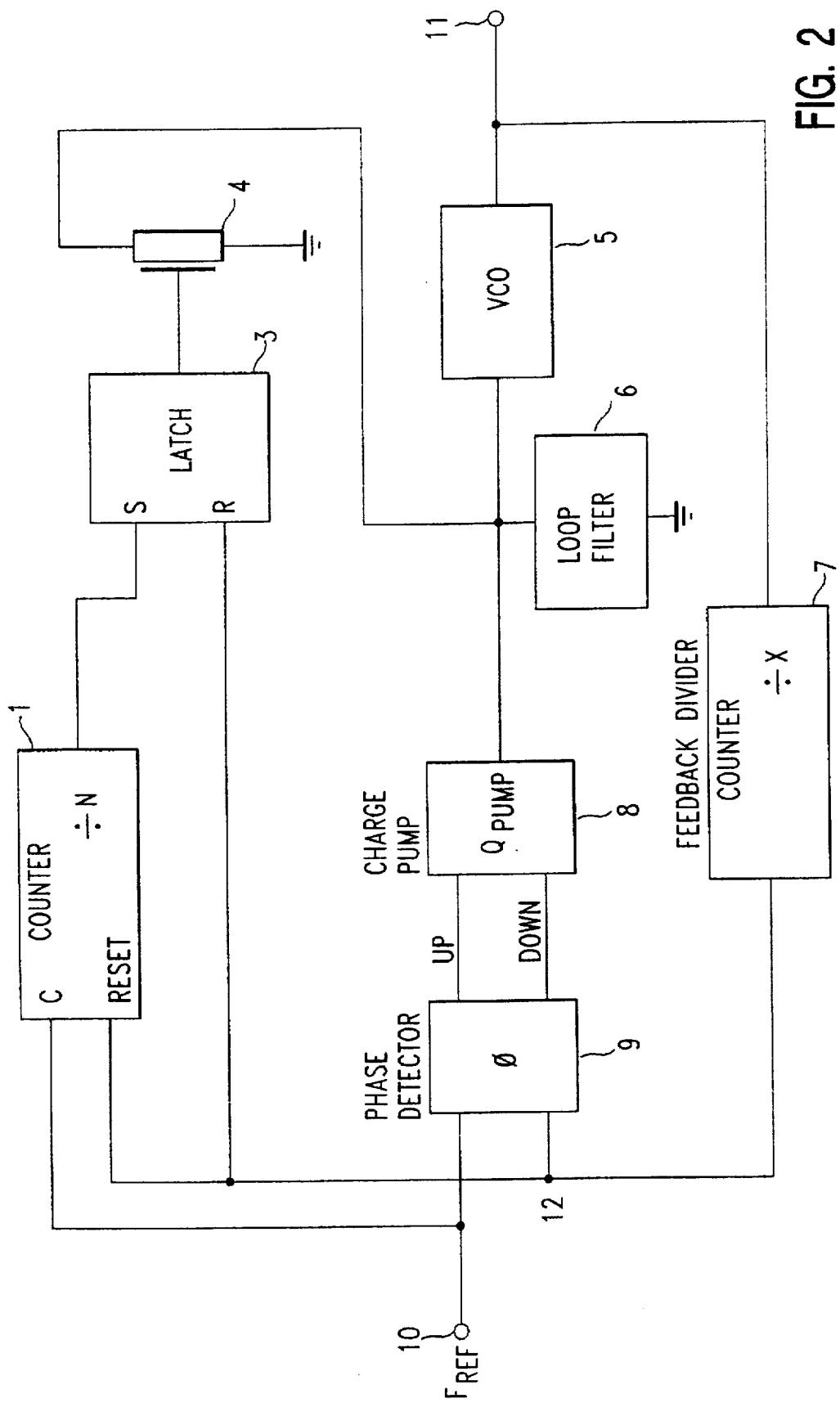
FIG. 2 illustrates another embodiment of the present invention coupled to a conventional PLL.

Referring to FIG. 2, note that it is possible to implement the present invention without an M counter. In this case, the feedback divider's 7 output is connected directly to the reset inputs of the N counter 1 and the latch 3, and each output of the feedback divider 7 resets the counter 1 and latch 3. When the feedback divider fails to pass the VCO output, the counter will provide a set pulse to the latch 3 as described above. The charge subtractor 4 is designed to take more charge away from the filter 6 than the charge pump 8 can supply. This guarantees that the input to the VCO, as well as its output frequency, will be reduced when a high frequency latch-up condition occurs, allowing the loop to regain control.

Figure 3:
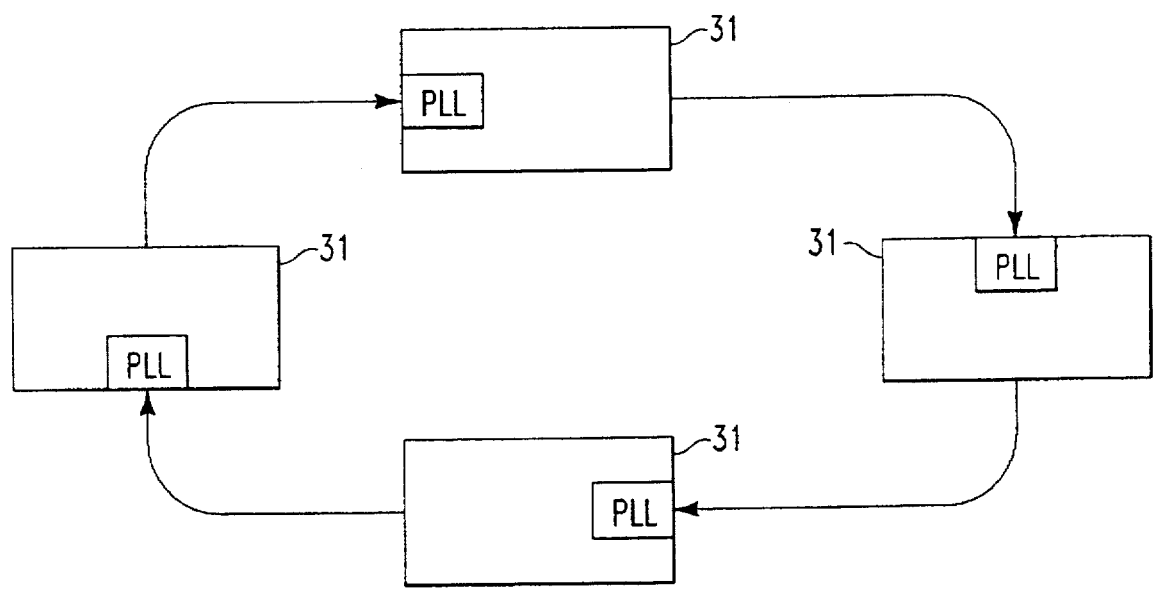
FIG. 3 illustrates a network embodiment of the present invention.
Figure 4:
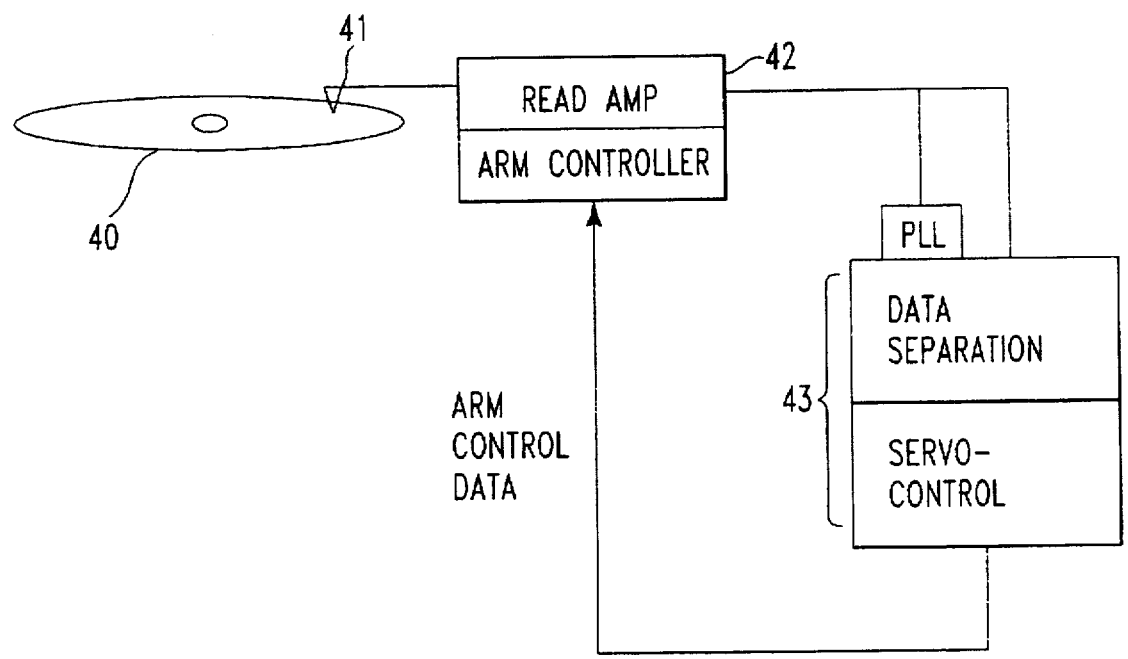
FIG. 4 illustrates a magnetic read/write head implementation of the present invention.

Referring to FIG. 3, an example implementation of the improved PLL described within a token-ring network is shown. Nodes 31, which may include a PC or workstation, within the network each ensure the reliability of data reception through use of the improved PLL which can be used to provide a clock to the node, for processing of data messages received at the node, based on the data message clock signal. FIG. 4 shows a second example implementation of the improved PLL for use in magnetic storage data retrieval. Data is read from a storage disk 40 via the magnetic head 41, and is transmitted to read circuitry 42,43 utilizing the improved PLL described herein for providing an output clock, based on the media clock, used to separate or decode data, arm control, and clock signals.

Advantages over the Prior Art

The advantages of the method of the preferred embodiment of this invention include: avoidance of high frequency latch-up, no introduction of new low frequency latch-ups, and minimal implementation over-head.

Alternative Embodiments

It will be appreciated that, although specific embodiments of the invention have been described herein for purposes of illustration, various modifications may be made without departing from the spirit and scope of the invention. In particular, it is also possible to couple the latch 3 output to the charge pump 8 to inhibit the charge pump's output. This would reduce the power requirement on the charge subtractor 4 but may complicate the charge pump circuit. The latch 3 output may also be used as an error flag to indicate to the higher levels of the system that the PLL is not locked. Also, for small values of X, the feedback divider magnitude, the M counter's input may be supplied directly from the VCO. The inventive circuit may be implemented, as a further example, in a graphics processor using the processor output to provide a faster pixel clock, or, alternatively, to provide a processor clock as a multiple of an input system clock.

Accordingly, the scope of protection of this invention is limited only by the following claims and their equivalents.

We claim:

1. A circuit comprising:
    a phase lock loop (PLL) including:
        a phase detector receiving a PLL input signal and a feedback divider output signal and providing a phase difference signal in response to the PLL input signal and the feedback divider output signal;
        a charge pump coupled to the phase detector for controlling a voltage at a charge pump output in response to the phase difference signal;
        a voltage controlled oscillator (VCO) coupled to the charge pump output for outputting a VCO signal corresponding to the voltage at the charge pump output; and
        a feedback divider coupled to the VCO for receiving the VCO signal and for outputting a feedback divider signal proportional to the VCO signal; and
    an anti-latching circuit including:
        a counter for counting the PLL input signal;
        means, coupled to the feedback divider, for resetting the counter to zero at each pulse of the feedback divider signal;
        means for outputting a reset signal in response to the counter reaching a predetermined number; and
        means, coupled to the charge pump output, for reducing the voltage at the charge pump output in response to the reset signal.

2. The circuit according to claim 1, wherein the means for outputting a reset signal comprises a set/reset latch.

3. The circuit according to claim 2, wherein the means for reducing the voltage at the charge pump output comprises an NFET transistor coupled to ground.

4. A circuit comprising:
    a phase lock loop (PLL) including:
        a phase detector receiving a PLL input signal and a feedback divider output signal and providing a phase difference signal in response to the PLL input signal and the feedback divider output signal;
        a charge pump coupled to the phase detector for controlling a voltage at a charge pump output in response to the phase difference signal;
        a voltage controlled oscillator (VCO) coupled to the charge pump output for outputting a VCO signal corresponding to the voltage at the charge pump output; and
        a feedback divider coupled to the VCO for receiving the VCO signal and for outputting a feedback divider signal having a proportional relationship to the VCO signal; and
    an anti-latching circuit including:
        a first counter for counting pulses of the feedback divider signal;
        a second counter for counting pulses of the PLL input signal;
        means for resetting the second counter to zero at each $M^{th}$ pulse of the feedback divider signal, wherein M is a first predetermined number;
        means for outputting a reset signal in response to the second counter reaching a second predetermined number, the second predetermined number being greater than the first predetermined number; and
        means, coupled to the charge pump output, for reducing the voltage at the charge pump output in response to the reset signal.

5. An anti-latching circuit for a phase lock loop (PLL) having a feedback divider coupled to a voltage controlled oscillator (VCO), the anti-latching circuit comprising:
    detecting means for detecting a pre-selected difference between a rate of feedback divider output signals and a rate of PLL input signals, and for outputting a reset signal when the pre-selected difference occurs; and
    voltage control means coupled to the detecting means for reducing an output frequency of the VCO in response to the reset signal from the detecting means.

6. The circuit of claim 5, wherein the detecting means includes a circuit for counting a number of pulses of the PLL input signals.

7. The circuit of claim 6, wherein the detecting means further includes a circuit for counting a number of pulses of the feedback divider output signals.

8. The circuit of claim 5, wherein the voltage control means includes a transistor coupled to an input of the VCO for reducing a VCO input voltage.

9. The circuit of claim 8, wherein the voltage control means further includes a latch for turning the transistor on and off in response to the reset signal from the detecting means.

10. A method of operating a phase lock loop (PLL) having a feedback divider and a voltage controlled oscillator (VCO), comprising the steps of:
    a) counting PLL input signals;
    b) restarting the counting of step a) with each output pulse of the feedback divider; and
    c) reducing an input voltage to the VCO in response to a count resulting from step a) reaching a predetermined value.

11. A method of operating a phase lock loop (PLL) having a feedback divider and a voltage controlled oscillator (VCO), comprising the steps of:

a) counting PLL input signals;
 b) counting feedback divider output signals;
 c) restarting the counting of PLL input signals in step a) each time a feedback divider output signal count reaches a first predetermined number; and
 d) reducing an input voltage to the VCO in response to a PLL input signal count resulting from step a) reaching a second predetermined number, the second predetermined number being greater than the first predetermined number.

12. In a storage system which includes a PLL coupled to a read/write head for retrieving and receiving data from the storage system, the PLL having a feedback divider coupled to a voltage controlled oscillator (VCO), the improvement comprising:

detecting means for detecting a pre-selected difference between a rate of feedback divider output signals and a rate of PLL input signals, and for outputting a reset signal when the pre-selected difference occurs; and
 voltage control means coupled to the detecting means for reducing an output frequency of the VCO in response to the reset signal from the detecting means.

13. A communication network comprising:

a plurality of nodes each including one of a plurality of PLLs for receiving data from others of said nodes;
 the PLLs each including:
 a feedback divider coupled to a voltage controlled oscillator (VCO);
 detecting means for detecting a pre-selected difference between a rate of feedback divider output signals and a rate of PLL input signals, and for outputting a reset signal when the pre-selected difference occurs; and
 voltage control means coupled to the detecting means for reducing an output frequency of the VCO in response to the reset signal from the detecting means.

14. An anti-latching circuit for a phase lock loop having a feedback divider coupled to a voltage controlled oscillator (VCO), the anti-latching circuit comprising:

detecting means for detecting an absence of output signals from the feedback divider; and
 voltage control means coupled to the detecting means for reducing an output frequency of the VCO in response to a signal from the detecting means.

15. The circuit of claim 4 further comprising reset means, coupled to the means for outputting a reset signal, for resetting the first counter in response to the reset signal.

* * * * *